United States Patent
Kang et al.

(10) Patent No.: US 7,420,219 B2
(45) Date of Patent: *Sep. 2, 2008

(54) WHITE LIGHT EMITTING DIODE COMPONENT HAVING TWO PHOSPHORS AND RELATED PHOSPHOR AND FORMATION METHOD

(75) Inventors: Chia-Cheng Kang, Taipei (TW); Ru-Shi Liu, Hsin-Chu Hsien (TW); Hung-Yuan Su, Taipei Hsien (TW)

(73) Assignee: Lite-On Technology Corp., Neihu, Taipei (TW)

( * ) Notice: Subject to any disclaimer, the term of this patent is extended or adjusted under 35 U.S.C. 154(b) by 146 days.

This patent is subject to a terminal disclaimer.

(21) Appl. No.: 11/162,908

(22) Filed: Sep. 28, 2005

(65) Prior Publication Data
US 2006/0231849 A1    Oct. 19, 2006

(30) Foreign Application Priority Data
Apr. 18, 2005 (CN) .................. 2005 1 0065615

(51) Int. Cl.
*H01L 29/20* (2006.01)
(52) U.S. Cl. .................. 257/98; 257/89; 257/E33.061; 313/502

(58) Field of Classification Search .............. 257/89, 257/98, E33.061; 313/502
See application file for complete search history.

(56) References Cited

U.S. PATENT DOCUMENTS

| 6,635,363 | B1 * | 10/2003 | Duclos et al. | 428/690 |
| 6,670,748 | B2 * | 12/2003 | Ellens et al. | 313/503 |
| 7,119,376 | B1 * | 10/2006 | Liu et al. | 257/98 |
| 2004/0188697 | A1 * | 9/2004 | Brunner et al. | 257/99 |
| 2006/0076883 | A1 * | 4/2006 | Himaki et al. | 313/503 |

\* cited by examiner

*Primary Examiner*—Howard Weiss
*Assistant Examiner*—John C Ingham
(74) *Attorney, Agent, or Firm*—Winston Hsu

(57) ABSTRACT

A white light emitting diode component capable of emitting white light includes an LED chip capable of emitting luminescent light, a first phosphor for absorbing first luminescent light of the luminescent light and emitting first emission, and a second phosphor for absorbing second luminescent light of the luminescent light and emitting second emission. A blend of the luminescent light (except for the first and the second luminescent light) and the first and the second emissions forms the white light. The first phosphor has a chemical formula of $(Ca_{1-x-y}Eu_xM_y)Se$, where x is not equal to zero, y is between zero and one, and M is composed of at least one element selected from a group consisting of Be, Mg, Sr, Ba, and Zn.

6 Claims, 6 Drawing Sheets

WHITE LIGHT EMITTING DIODE COMPONENT HAVING TWO PHOSPHORS AND RELATED PHOSPHOR AND FORMATION METHOD

BACKGROUND OF THE INVENTION

1. Field of the Invention

The present invention relates to a light-emitting diode (LED), and more particularly, to a white light LED component having a single LED chip and two kinds of phosphor.

2. Description of the Prior Art

Having the advantages of low power consumption, long lifespan (about ten times as long as that of an incandescent lamp), and, most importantly, high color rendering index (CRI) such that a white light LED (W-LED) component is capable of generating visible radiation that will not damage art, it has become one of the most popular illuminating devices in a competitive market demanding a high CRI.

An easy method for making a W-LED component is to combine a blue light LED chip capable of emitting blue light and a red light LED chip capable of emitting red light with a green light LED chip capable of emitting green light to form the W-LED component. The W-LED component is therefore capable of emitting white light, which is formed by mixing the blue light, the red light, and the green light.

However, the above three-in-one W-LED component is expensive, for it has to include three LED chips. Moreover, since the three LED chips each have a light-emitting efficiency different from one-another (The light-emitting efficiency of the blue LED chip is higher than the light-emitting efficiency of the red/green LED chip.), the white light emitted by the W-LED component, which is composed of the three LED chips, has a low CRI.

In order to overcome the above drawbacks, Nichia Chemical Co. disclosed a W-LED component consisting of a single LED chip and phosphor having a chemical formula of $(Y_{1-p-q-r}Gd_pCe_qSm_r)_3(Al_{1-s}Ga_s)_5O_{12}$ where p is between 0-0.8, q is between 0.003-0.2, r is between 0.0003-0.08, and s is between 0-1. The single LED chip is capable of emitting luminescent light. The phosphor is doped into epoxy resin used to cover the single LED chip. It is capable of absorbing luminescent light with predetermined wavelength, such as the luminescent light emitted by the single LED chip, and emitting an emission. As a result, the luminescent light emitted by the single LED chip, except the predetermined luminescent light, combines with the emission emitted by the phosphor to form white light.

The W-LED component disclosed by Nichia Chemical Co. comprises nothing but the single LED chip and photoluminescence phosphor; it is a mature and cheap product.

However, in addition to the phosphor having the chemical formula of $(Y_{1-p-q-r}Gd_pCe_qSm_r)_3(Al_{1-s}Ga_s)_5O_{12}$, a variety of phosphors can be used to be combined with the single LED chip to form a W-LED.

Moreover, in order to improve CRI, the prior art's W-LED component comprises another red phosphor CaS:Eu. The red phosphor CaS:Eu, which comprises an S-compound, lacks of stability. For example, the red phosphor CaS:Eu decomposes easily in humid and high temperature environments. As a result, a W-LED component having unstable red phosphor CaS:Eu has a poor CRI and a short lifespan.

SUMMARY OF THE INVENTION

The primary purpose of the claimed invention is, therefore, to provide a white light emitting diode component and related phosphor formation method.

The W-LED component includes a light-emitting chip for emitting luminescent light; a first phosphor for absorbing first luminescent light of the luminescent light and emitting first emission, the first luminescent light having a first wavelength different from that of the first emission, the first phosphor having a first chemical formula of $(Ca_{1-x-y}Eu_xM_y)Se$ where x is not equal to zero, y is between zero and one, and M comprises one element selected from a first group consisting of Be, Mg, Sr, Ba, and Zn; and a second phosphor for absorbing second luminescent light of the luminescent light and emitting second emission, the second luminescent light having a second wavelength different from that of the second emission, the second phosphor having a second chemical formula of $(Lu_xQ_yCe_z)Al_5O_{12}$ where x+y+z is equal to three, z is between zero and 0.5, and Q comprises one element selected from a second group consisting of Tb, Y and Yb, wherein a mixing of the luminescent light (excluding the first and the second luminescent light emitted by the light-emitting chip), the first emission and the second emission forms white light.

The formation method includes providing $CaCO_3$, $Eu_2O_3$, and Se powder; grinding and blending $CaCO_3$, $Eu_2O_3$, Se powder, and reactants comprising one element selected from a group consisting of Be, Mg, Sr, Ba, and Zn; placing the ground and blended $CaCO_3$, $Eu_2O_3$, and Se powder in a reduction atmosphere; heating the ground and blended $CaCO_3$, $Eu_2O_3$, and Se powder in the reduction atmosphere at a predetermined rate of temperature increase to a predetermined temperature, and performing a reduction sintering process for a predetermined period of time in order to form a chemical compound; cooling the chemical compound at a predetermined rate of temperature decrease to room temperature, and forming phosphor having a chemical formula of $(Ca_{1-x-y}Eu_xM_y)Se$ where x is not equal to zero, y is between zero and one, and M comprises one element selected from a first group consisting of Be, Mg, Sr, Ba, and Zn.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
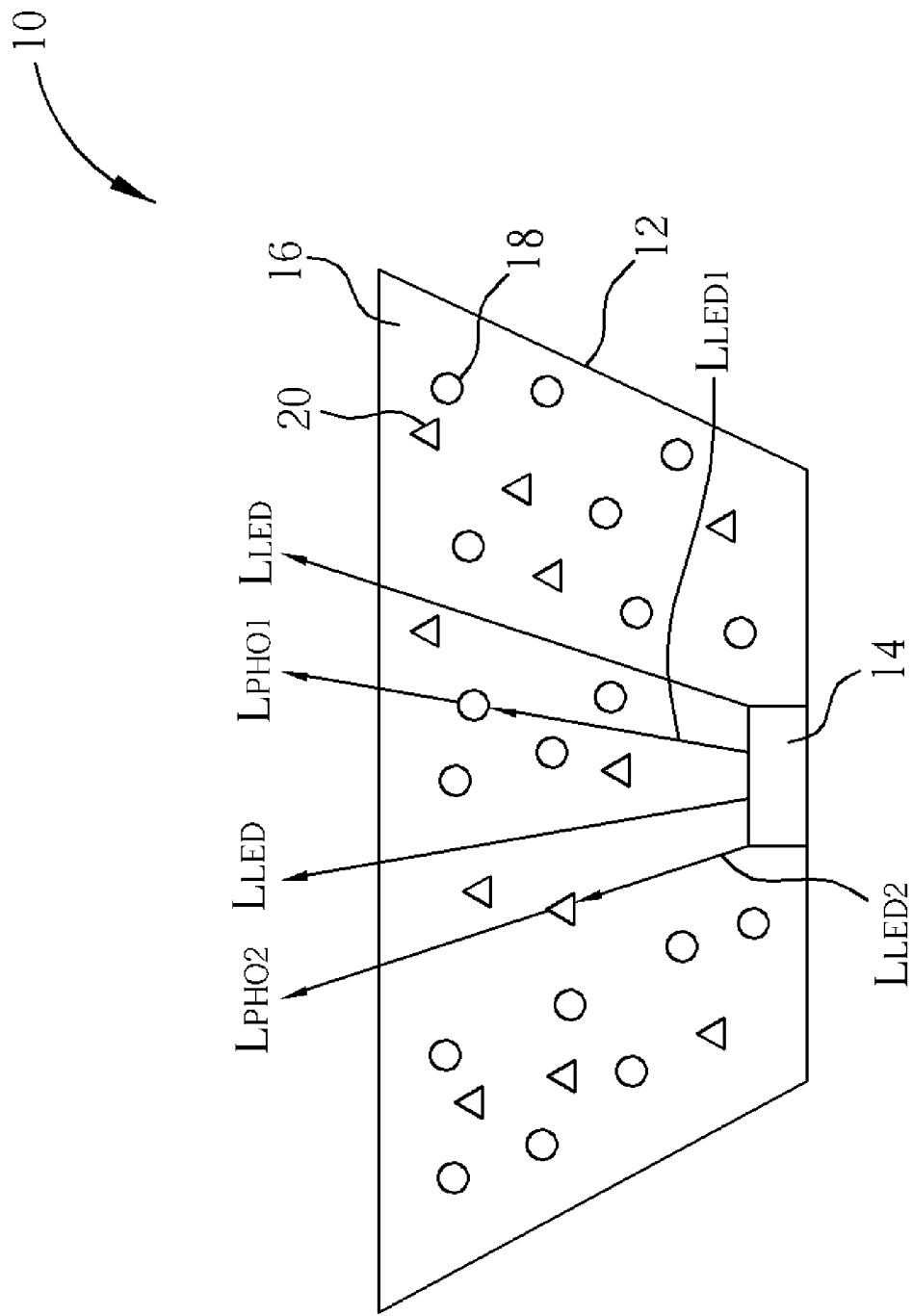
FIG. 1 is a schematic diagram of a W-LED component of the preferred embodiment according to the present invention.

Please refer to FIG. 1, which is a schematic diagram of a W-LED component 10 of the preferred embodiment according to the present invention. The component 10 comprises a cup-shaped housing 12, an LED chip 14 installed on a bottom part of the housing 12 for emitting luminescent light $L_{LED}$, epoxy resin 16 filling the housing 12 for covering the LED chip 14, and first and second phosphors 18 and 20, both of which are doped into the epoxy resin 16 for absorbing first and second luminescent light $L_{LED1}$ and $L_{LED2}$ of the luminescent light $L_{LED}$ emitted by the LED chip 14 and emitting first and second emission $L_{PHO1}$ and $L_{PHO2}$. The first emission $L_{PHO1}$ has a wavelength different from the first luminescent light $L_{LED1}$. The second emission $L_{PHO2}$ has a wavelength different from the second luminescent light $L_{LED2}$.

According to the present invention, the luminescent light $L_{LED}$ emitted by the LED chip 14 has a dominant wavelength of between 380 and 480 nanometers. That is, the luminescent light $L_{LED}$ emitted by the LED chip 14 is between indigo and blue. The first phosphor 18 has a chemical formula of $(Ca_{1-x-y}Eu_xM_y)Se$, where x is not equal to zero, y is between zero and one, and M is composed of at least one element selected from a group consisting of Be, Mg, Sr, Ba, and Zn. The first phosphor 18 absorbs the first indigo (or blue) light $L_{LED1}$, and emits the first emission $L_{PHO1}$, which is orange. The CaSe acts as a first host of the first phosphor 18. Eu, as well as M, act as first foreign ions doped into the first host, and can be incorporated into the first host to form a first activator capable of emitting the first emission $L_{PHO1}$. The second phosphor 20 has a chemical formula of $(Lu_xQ_yCe_z)Al_5O_{12}$, where x+y+z is equal to three, z is between zero and 0.5, and Q is composed of at least one element selected from a second group consisting of Tb, Y and Yb. Similarly, the second phosphor 20 absorbs the second indigo (or blue) light $L_{LED2}$, and emits the second emission $L_{PHO2}$, which is yellow-green. The $Lu_xAl_5O_{12}$ acts as a second host of the second phosphor 20. The Q as well as the Ce act as second foreign ions doped into the second host, and can be incorporated into the second host to form a second activator capable of emitting the second emission $L_{PHO2}$.

As a result, the component 10 emits the white light $L_{WH}$, which is a mixing of the luminescent light $L_{LED}$ (except for the first and the second luminescent light $L_{LED1}$ and $L_{LED2}$), the first emission $L_{PHO1}$ emitted by the first phosphor 18, and the second emission $L_{PHO2}$ emitted by the second phosphor 20.

To improve the CRI and uniformity of the white light $L_{WH}$ emitted by the component 10, the first phosphor 18 and the second phosphor 20 have a particle diameter smaller than 20 micrometers and an average particle diameter equal to about five micrometers.

Figure 2:
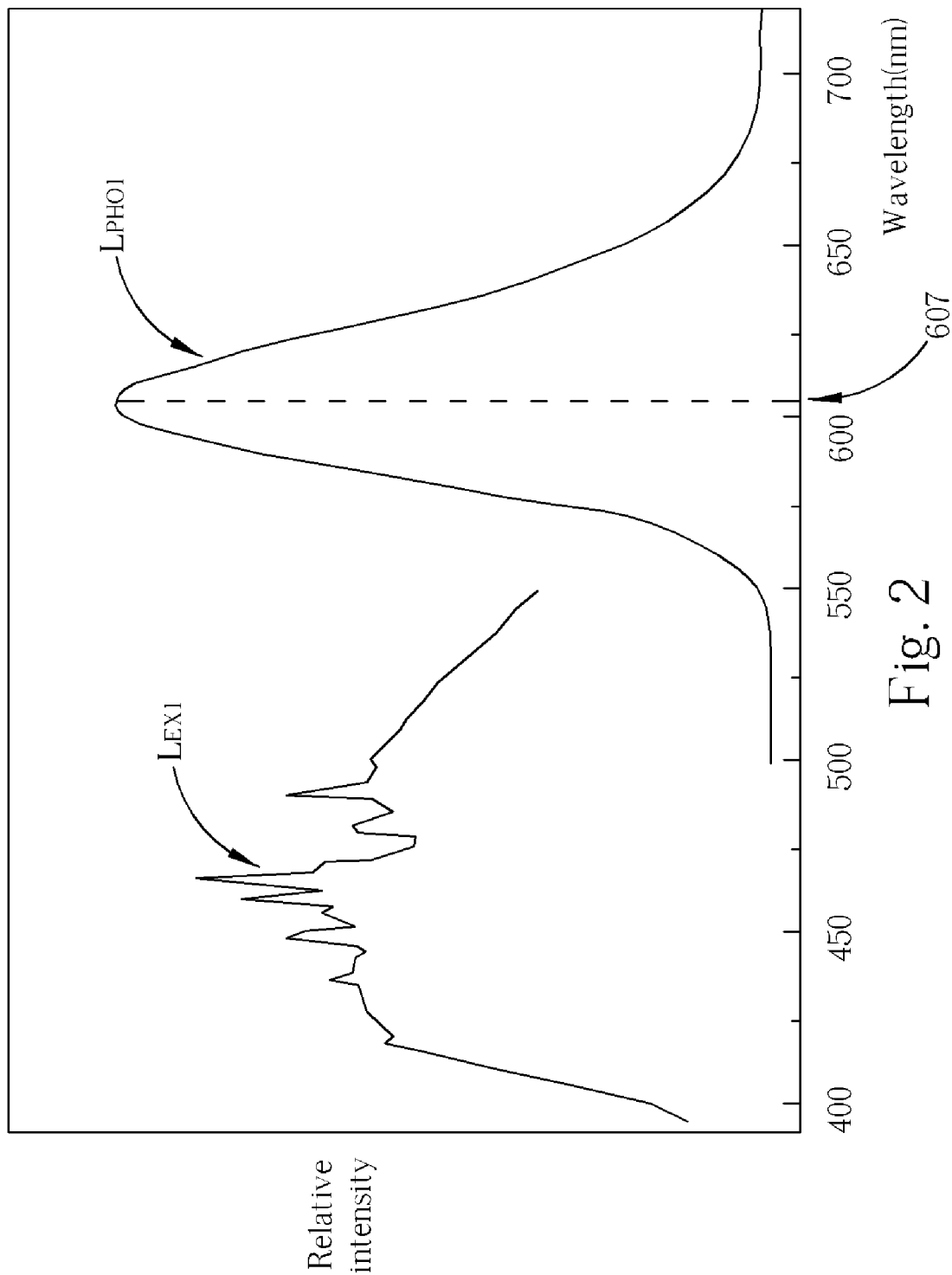
FIG. 2 is a spectrum diagram of the first emission $L_{PHO1}$ as well as a first excitation $L_{EX1}$ capable of exciting the first phosphor 18 to emit the first emission $L_{PHO1}$.
Figure 3:
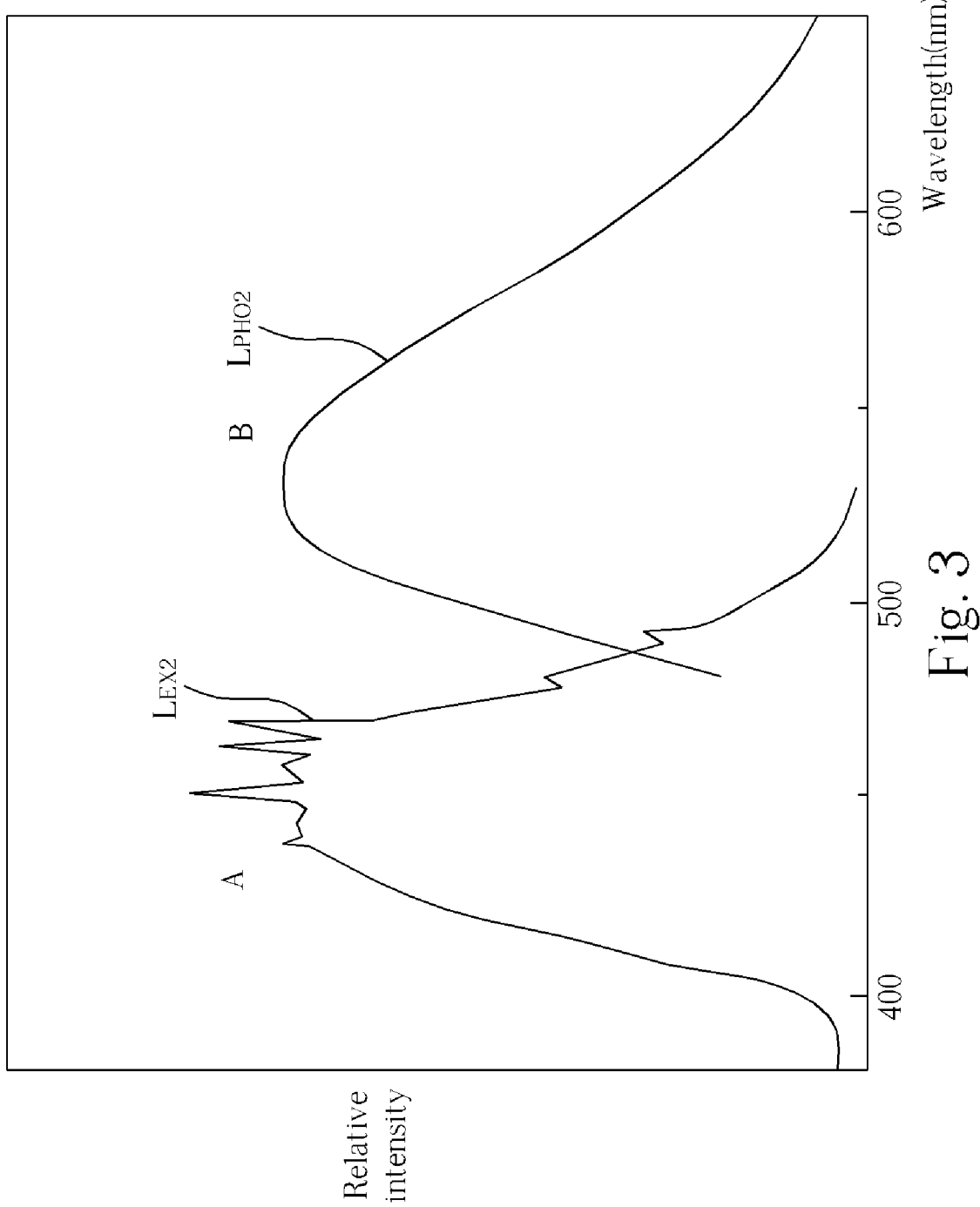
FIG. 3 is a spectral diagram of the second emission $L_{PHO2}$ as well as a second excitation $L_{EX2}$ capable of causing the second phosphor 20 to emit the second emission $L_{PHO2}$.
Figure 4:
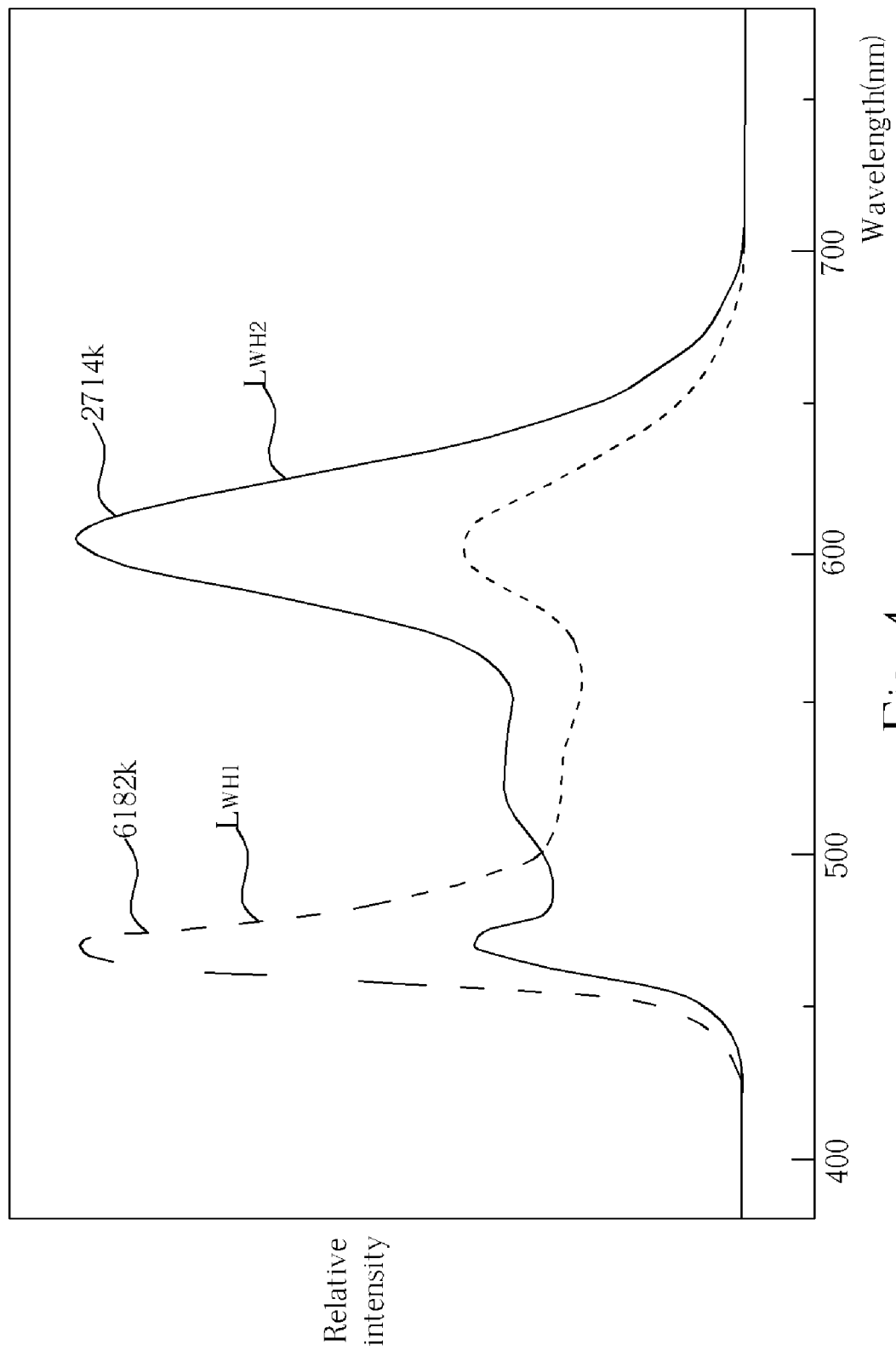
FIG. 4 is a spectral diagram of the white light $L_{WH}$ emitted by the component 10, where an abscissa represents the wavelength of the white light $L_{WH}$, and an ordinate represents the relative intensity of the white light $L_{WH}$.
Figure 5:
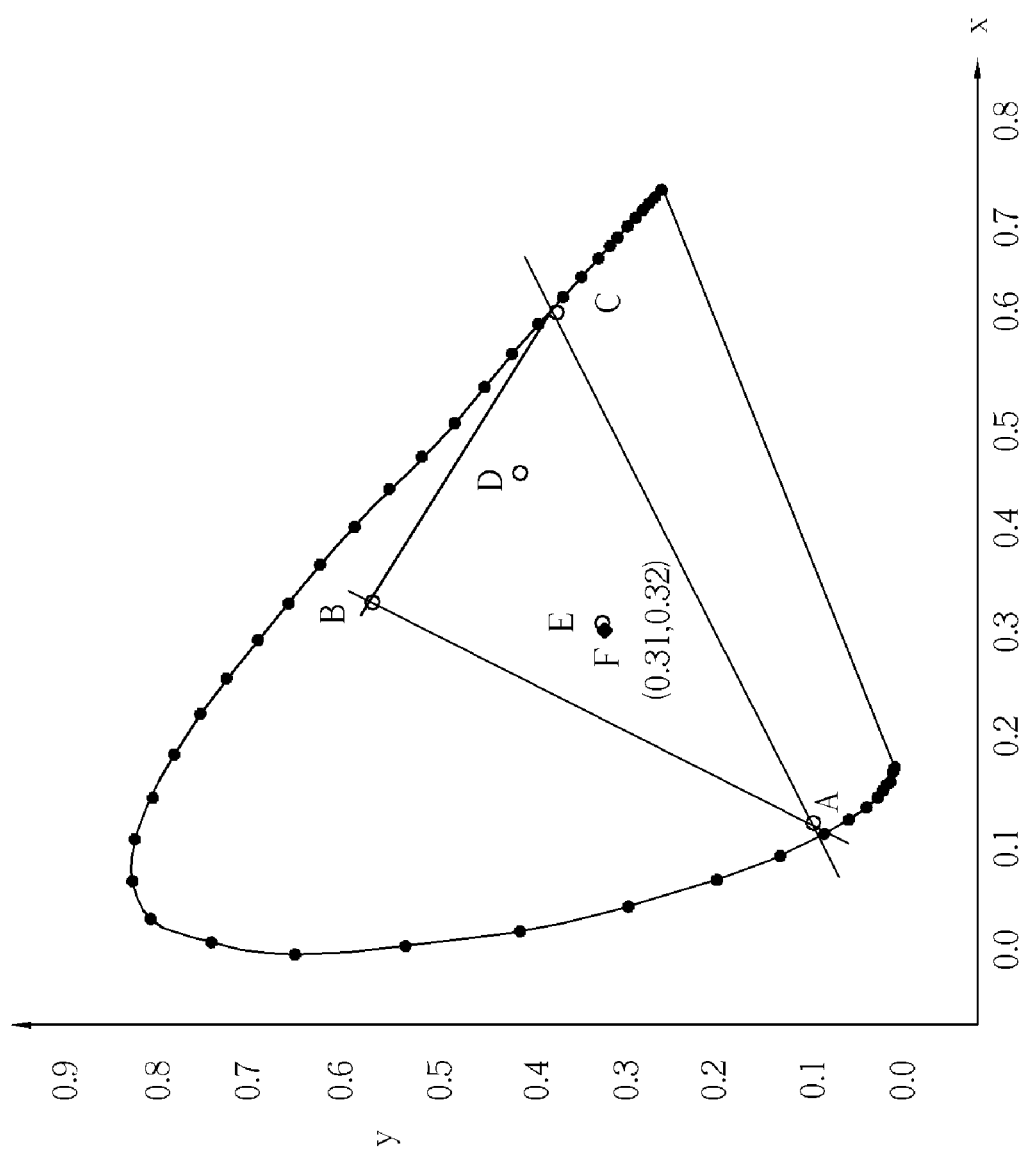
FIG. 5 is a CIE chromaticity diagram of CIE chromaticity corresponding to light in the W-LED component shown in FIG. 1.

Please refer to FIGS. 2-5. FIG. 2 is a spectrum diagram of the first emission $L_{PHO1}$ as well as a first excitation $L_{EX1}$ capable of exciting the first phosphor 18 to emit the first emission $L_{PHO1}$, wherein an abscissa represents wavelengths of the first emission $L_{PHO1}$ and the first excitation $L_{EX1}$, an ordinate represents relative intensity of the first emission $L_{PHO1}$ and the first excitation $L_{EX1}$. The first excitation $L_{EX1}$ has a dominant wavelength equal to that of the luminescent light $L_{LED}$ emitted by the LED chip 14, and the x and the y in the chemical formula of the first phosphor 18 are equal to 0.005 and 0 respectively. FIG. 3 is a spectral diagram of the second emission $L_{PHO2}$ as well as a second excitation $L_{EX2}$ capable of causing the second phosphor 20 to emit the second emission $L_{PHO2}$. An abscissa represents wavelengths of the second emission $L_{PHO2}$ and the second excitation $L_{EX2}$, an ordinate represents relative intensity of the second emission $L_{PHO2}$ and the second excitation $L_{EX2}$. The second excitation $L_{EX2}$ has a dominant wavelength equal to that of the luminescent light $L_{LED}$ emitted by the LED chip 14. FIG. 4 is a spectral diagram of the white light $L_{WH}$ emitted by the component 10, where an abscissa represents the wavelength of the white light $L_{WH}$, and an ordinate represents the relative intensity of the white light $L_{WH}$. Because the component 10 comprises two kinds of phosphor, adjusting the relative intensity of the luminescent light $L_{LED}$, the first emission $L_{PHO1}$, and the second emission $L_{PHO2}$ can yield a variety of shades of white light, such as a white light $L_{WH1}$ indicated by dashed lines which has a color temperature of 6182K, or a white light $L_{WH2}$ which is indicated by solid lines and has a color temperature of 2714K. FIG. 5 is a CIE chromaticity diagram of CIE chromaticity coordinates corresponding to the luminescent light $L_{LED}$, the first emission $L_{PHO1}$, the second emission $L_{PHO2}$, the white light $L_{WH2}$ having the color temperature of 2714K, the white light $L_{WH1}$ having the color temperature of 6182K, and an ideal white light $L_{WH0}$, where an abscissa represents an x-chromaticity coordinate, an ordinate represents a y-chromaticity coordinate, and A(0.1252, 0.0991), B(0.3370, 0.5698), C(0.6154, 0.3790), D(0.4603, 0.4133), E(0.3191, 0.3262), and F(0.31, 0.32) represent six chromaticity points respectively corresponding to the luminescent light $L_{LED}$ having a wavelength equal to 470 nanometers, the first emission $L_{PHO1}$ excited by the luminescent light $L_{LED1}$ and having a wavelength equal to 470 nanometers, the second emission $L_{PHO2}$ excited by the luminescent light $L_{LED2}$ and having a wavelength equal to 470 nanometers, the white light $L_{WH2}$ having the color temperature of 2714K, formed through a blending of the first and the second emissions $L_{PHO1}$ and $L_{PHO2}$ and the luminescent light $L_{LED}$, and, the white light $L_{WH1}$ having the color temperature of 6182K, formed also through a blending of the first and the second emission $L_{PHO1}$ and $L_{PHO2}$ and the luminescent light $L_{LED}$, and the genuine white light $L_{WH0}$.

According to the preferred embodiment, the first phosphor 18 is formed through a solid-state method, a co-precipitation method, a micro-emulsion method, or a gel method.

These methods have advantages, and disadvantages as well. For example, the co-precipitation method is complicated, but has a short reaction period. It is also is capable of generating small and well-mixed first phosphor 18. The first phosphor, if formed through the micro-emulsion method, has a specific surface area larger than that of phosphor formed through the conventional co-precipitation method.

Figure 6:
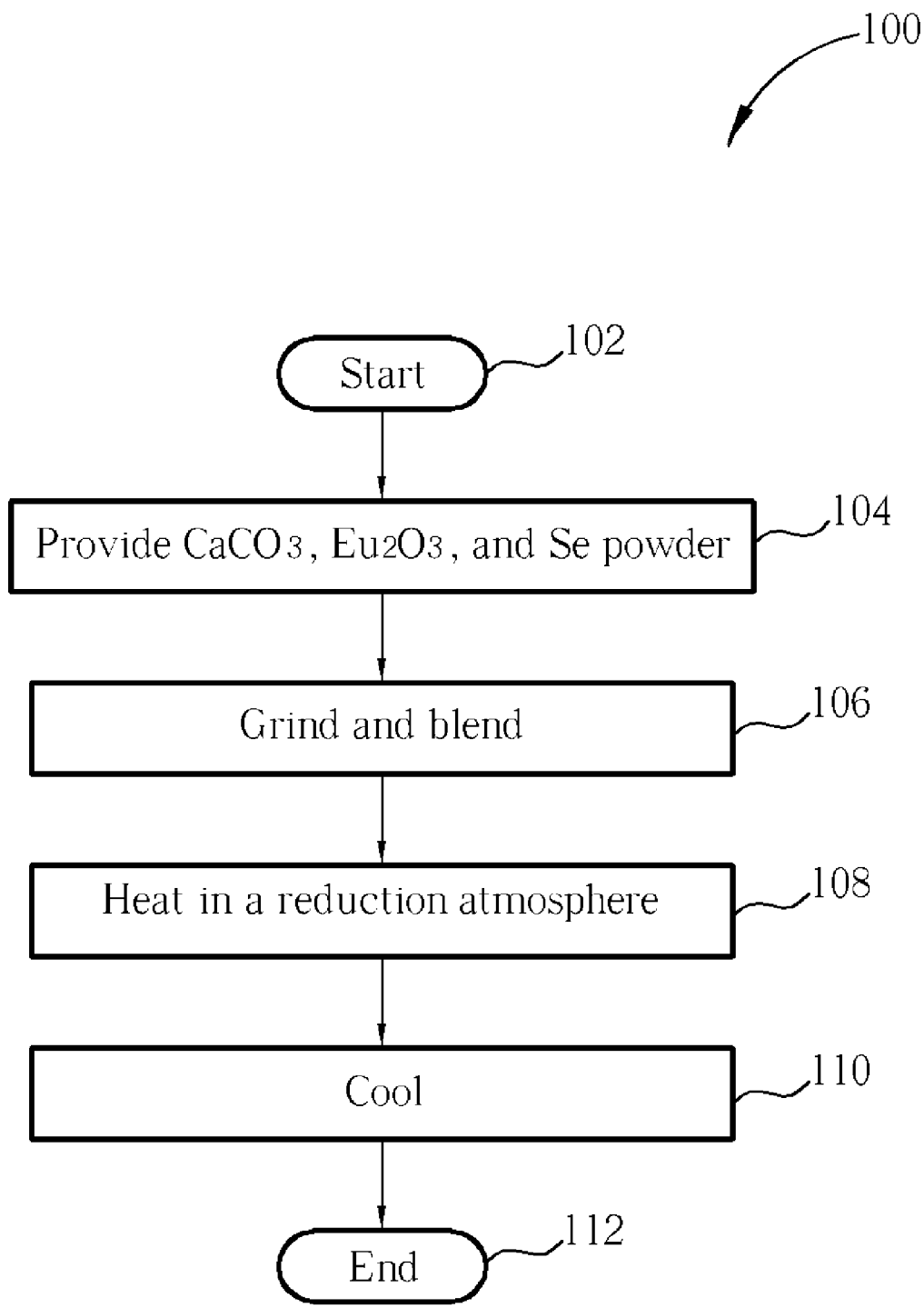
FIG. 6 is a flow chart of a formation method according to the present invention.

A formation method 100 of the first phosphor 18 is described as follows. Please refer to FIG. 6, which is a flow chart of the formation method 100 according to the present invention. The method 100 comprises the following steps:

Step 102: Start;

Step 104: Provide $CaCO_3$, $Eu_2O_3$, reactants comprising at least one element selected from a group consisting of Be, Mg, Sr, Ba, and Zn (such as SrO), and Se powder according to a predetermined stoichiometric ratio;

Step 106: Grind and blend $CaCO_3$, $Eu_2O_3$, and Se powder;

Step 108: Place the ground and blended $CaCO_3$, $Eu_2O_3$, and Se powder in a reduction atmosphere comprising $H_2/N_2$ (5%/95%), heat the ground and blended $CaCO_3$, $Eu_2O_3$, and Se powder in the reduction atmosphere at a predetermined rate of temperature increase of +5° C./second up to a predetermined temperature of 1200° C., and perform a reduction sintering process for a predetermined period of four hours to form a chemical compound;

(The reduction sintering process reduces $Eu^{3+}$ ions of he blended $CaCO_3$, $Eu_2O_3$, and Se powder into $Eu^{2+}$ ions, so as to promote the light intensity of the first phosphor 18. The predetermined temperature of the reduction sintering process is between 1000° C. and 1600° C. The predetermined time period of the reduction sintering process is between three and 24 hours. The reduction atmosphere comprises hydrogen and nitrogen gas, or hydrogen and argon gas.);

Step 110: Twelve hours later, cool the compound formed in step 108 to room temperature at −5° C./second to obtain the first phosphor 18; and Step 1112: End.

In contrast to the prior art, the present invention can provide a W-LED component having first and second phosphors 18 and 20, and an LED chip 14 for emitting luminescent light. The first and the second phosphor 18 and 20 absorb first and second luminescent light $L_{LED1}$ and $L_{LED2}$ and emit first and second emissions $L_{PHO1}$ and $L_{PHO2}$ respectively. The first emission $L_{PHO1}$ has a wavelength different from that of the first luminescent light $L_{LED1}$. The second emission $L_{LPHO2}$ has a wavelength different from that of the second luminescent light $L_{LED2}$. The luminescent light $L_{LED}$, except the first and second luminescent lights $L_{LED1}$ and $L_{LED2}$ emitted by the LED chip combines with the first emission $L_{PHO1}$ and the second emission $L_{PHO2}$ to form white light. The first phosphor 18 has a first chemical formula of $(Ca_{1-x-y}Eu_xM_y)Se$ where x is not equal to zero, y is between zero and one, and M is composed of at least one element selected from a first group consisting of Be, Mg, Sr, Ba, and Zn. The second phosphor 20 has a second chemical formula of $(Lu_xQ_yCe_z)Al_5O_{12}$ where x+y+z is equal to three, z is between zero and 0.5, and Q is composed of at least one element selected from a second group consisting of Tb, Y and Yb. The incorporation of the first and the second phosphor 18 and 20 replaces the red and the green LED chips in the prior art's three-in-one W-LED component, thus reducing the cost of the W-LED component, and increasing the CRI of the W-LED component. Moreover, the first phosphor 18, which has the chemical formula $(Ca_{1-x-y}Eu_xM_y)Se$, is stable. Even when placed in a humid and high temperature environment, the first phosphor 18 will not decompose. Lastly, the first phosphor 18, after being excited by luminescent light, has a light intensity stronger than that of the red phosphor CaS:Eu. In conclusion, The first phosphor is more suitable to be applied to a W-LED component than the red phosphor CaS:Eu.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode (LED) component comprising:
  a light-emitting chip for emitting luminescent light;
  a first phosphor for absorbing first luminescent light of the luminescent light and emitting first emission, the first luminescent light having a first wavelength different from that of the first emission, the first phosphor having a first chemical formula of (Ca1−x−yEuxMy)Se where x is not equal to zero, y is between zero and one, and M comprises one element selected from a first group consisting of Be, Mg, Sr, Ba, and Zn; and
  a second phosphor for absorbing second luminescent light of the luminescent light and emitting second emission, the second luminescent light having a second wavelength different from that of the second emission, the second phosphor having a second chemical formula of (LuxQyCez)Al5O12 where x+y+z is equal to three, z is between zero and 0.5, and Q comprises one element selected from a second group consisting of Tb, Y and Yb;
  wherein mixing of the first emission by the phosphor, the second emission emitted by the second phosphor, and luminescent light except the first and the second luminescent light emitted by the light-emitting chip forms white light.

2. The LED component of claim 1, wherein the luminescent light emitted by the light-emitting chip has a dominating wavelength of between 380-480 nanometers.

3. The LED component of claim 1, wherein the first phosphor has a particle diameter smaller than 20 micrometers.

4. The LED component of claim 3, wherein the first phosphor has an average particle diameter equal to 5 micrometers.

5. The LED component of claim 1, wherein the second phosphor has a particle diameter smaller than 20 micrometers.

6. The LED component of claim 5, wherein the second phosphor has an average particle diameter equal to 5 micrometers.

* * * * *

UNITED STATES PATENT AND TRADEMARK OFFICE
CERTIFICATE OF CORRECTION

PATENT NO. : 7,420,219 B2 Page 1 of 1
APPLICATION NO. : 11/162908
DATED : September 2, 2008
INVENTOR(S) : Chia-Cheng Kang et al.

It is certified that error appears in the above-identified patent and that said Letters Patent is hereby corrected as shown below:

On the title page, item (30), correct the application number of the Foreign Application Priority Data from "200510065615" to "200510065615.3"

Signed and Sealed this

Sixteenth Day of December, 2008

JON W. DUDAS
*Director of the United States Patent and Trademark Office*